United States Patent [19]
Kuo et al.

[11] Patent Number: 5,991,201
[45] Date of Patent: Nov. 23, 1999

[54] NON-VOLATILE MEMORY WITH OVER-PROGRAM PROTECTION AND METHOD THEREFOR

[75] Inventors: Clinton C. K. Kuo; Thomas Jew; David W. Chrudimsky, all of Austin, Tex.

[73] Assignee: Motorola Inc., Schaumburg, Ill.

[21] Appl. No.: 09/067,026

[22] Filed: Apr. 27, 1998

[51] Int. Cl.⁶ .................................................. G11C 16/04
[52] U.S. Cl. ............................. 365/185.19; 365/185.18; 365/185.22
[58] Field of Search ...................... 365/185.19, 185.18, 365/185.25, 185.22

[56] References Cited

U.S. PATENT DOCUMENTS

| | | | |
|---|---|---|---|
| 5,200,920 | 4/1993 | Norman et al. | 365/185.19 |
| 5,357,476 | 10/1994 | Kuo et al. | 365/218 |
| 5,440,505 | 8/1995 | Frazio et al. | 365/45 |
| 5,608,669 | 3/1997 | Mi et al. | 365/185.19 |
| 5,751,637 | 5/1998 | Chen et al. | 365/185.33 |

*Primary Examiner*—David Nelms
*Assistant Examiner*—Hoai V. Ho
*Attorney, Agent, or Firm*—Daniel D. Hill; Paul J. Polansky

[57] ABSTRACT

A floating-gate non-volatile memory (30) uses a relatively-low threshold voltage to define a programmed state. The memory (30) compensates for fast program cells by providing program pulses which increase in length and magnitude while the cells are being programmed. Between each program pulse the memory (30) determines whether selected cells have been adequately programmed. The memory (30) ceases applying the series of pulses to each cell when it has been adequately programmed. Thus the memory (30) avoids the over-program condition instead of compensating for it.

14 Claims, 4 Drawing Sheets

NON-VOLATILE MEMORY WITH OVER-PROGRAM PROTECTION AND METHOD THEREFOR

CROSS REFERENCE TO RELATED, COPENDING APPLICATION

Related subject matter is contained in copending patent application No. 08/818,273, entitled "Automatic Transition Charge Pump for Non-volatile Memories," invented by Khoi Van Dinh, filed Mar. 17, 1997 and assigned to the assignee hereof.

FIELD OF THE INVENTION

This invention relates generally to non-volatile memories, and more particularly to over-programming protection for a non-volatile memory.

BACKGROUND OF THE INVENTION

Floating gate non-volatile memories such as erasable programmable read only memories (EPROMs), electrically erasable programmable read only memories (EEPROMs), block erasable ("flash") EEPROMs, and one time programmable read only memories (OTPROMs) are becoming popular for many electronic applications such as automotive control, consumer products such as tapeless answering machines, and the like. In floating gate memories, the state of each memory cell is determined by the amount of charge stored on a floating gate. The floating gate is isolated from an underlying channel by a region of oxide. Typically, the floating gate transistor is programmed and erased by processes known as Fowler-Nordheim tunneling and hot carrier injection. Recently floating gate memory cells have been both programmed and erased by Fowler-Nordheim tunneling.

There are many alternative configurations of floating gate non-volatile memory cells. For example, some configurations known as "2T" designs use a select transistor which is separate from the floating gate transistor. However, because of the additional integrated circuit area required for such configurations, the single transistor ("1T") design has become increasingly popular. The transistor in the 1T cell has a floating gate and a control gate stack which performs the same function as both the select gate and the control gate of the 2T design.

Floating gate memory cells must be able to be programmed, erased, and reprogrammed a large number of times to be useful for typical applications. For example in present technology a commercially available floating gate memory device must be able to be erased and reprogrammed approximately 10,000 times. The effect of erasing and reprogramming, however, can create problems for storing bits in floating gate memory cells. For example, the amount of time it takes to program the memory cell may vary with the number of times the cell has been programmed, as well as by processing differences across the array.

In particular it has been observed that the distributions of programming times to achieve a desired programmed threshold voltage can vary in a roughly bimodal fashion. In this typical distribution a small number of memory cells, known as "fast programming" memory cells, can be programmed in a relatively short period of time, whereas the majority of memory cells require a longer time. The fast programming memory cells will skew the distribution of program times or may even create a bimodal like distribution. This skewed distribution creates a problem in selecting the best method of programming new values into the memory array. If the programming is performed long enough to accommodate the majority of cells, the fast programming cells will tend to become over-programmed. As used herein, an "over-programmed" transistor has a threshold voltage which is very close to zero volts and may actually be negative. When a transistor's threshold becomes negative, it acts like a programmed cell whether selected or not. For a memory architecture using a 1T bit cell, over-programming causes a bit line failure.

One known technique accounts for the low threshold voltages by applying high voltages to slowly bring the threshold back to within the desired range. Such a technique is taught in U.S. Pat. No. 5,357,476, entitled "Apparatus and Method for Erasing a Flash EEPROM," invented by Clinton C. K. Kuo et al. The memory disclosed in this patent used floating gate transistors with low threshold voltages to represent the erased state. Since all transistors within a block were simultaneously erased with the same pulses, selecting the erasure sequence according to the characteristics of the majority of transistors and then selectively correcting the over-erased cells was advantageous. However, some memories now use the low threshold voltage to be the programmed state. What would be desirable therefore is a technique and a non-volatile memory using such a technique which prevents over-programming before it occurs. Such a technique and a non-volatile memory using that technique is provided by the present invention, whose features and advantages will be more clearly understood from the following detailed description taken in conjunction with the accompanying drawings.

DETAILED DESCRIPTION OF A PREFERRED EMBODIMENT

Figure 1:
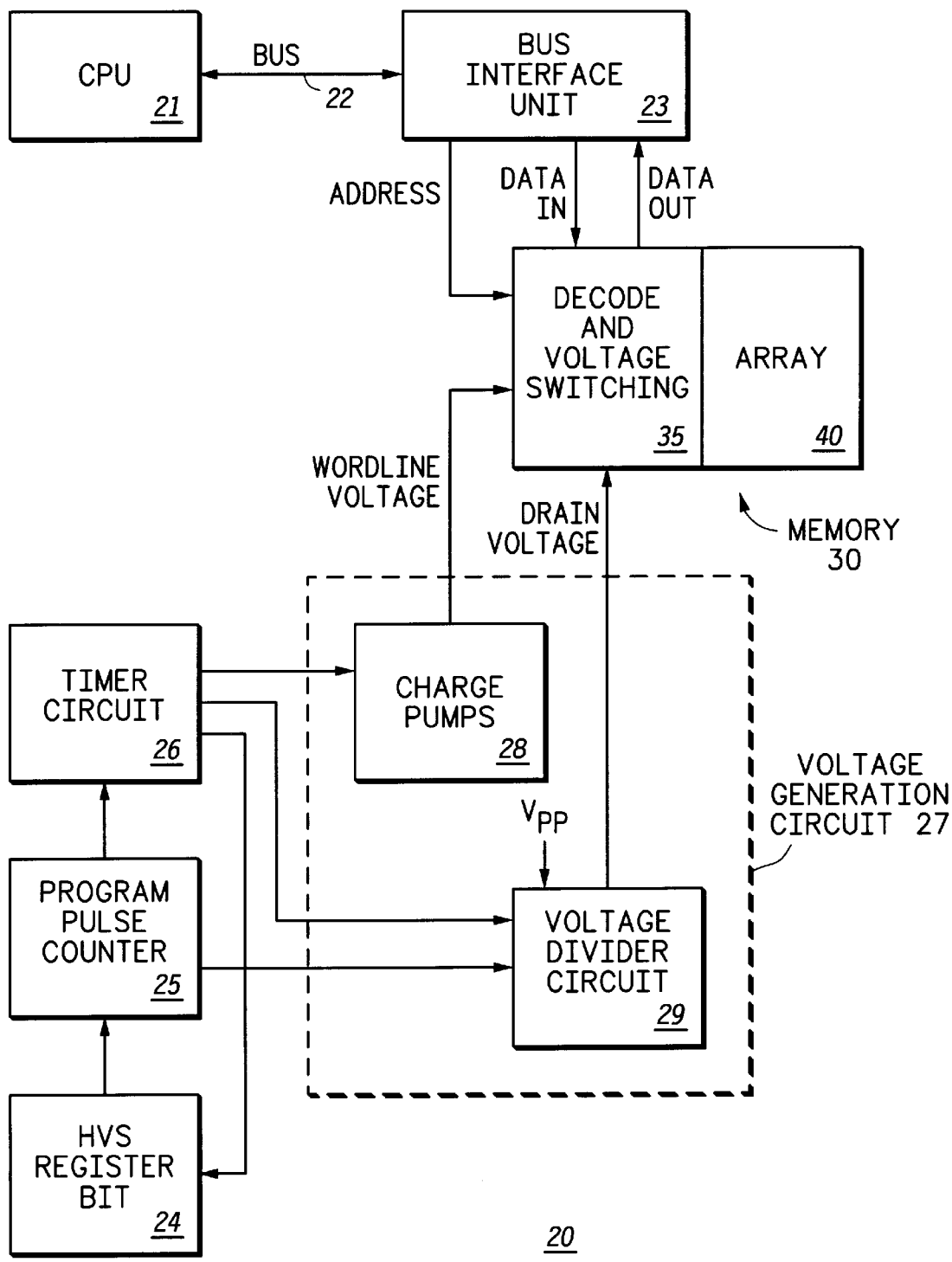
FIG. 1 illustrates in block diagram form a data processing system having a non-volatile memory according to the present invention.

FIG. 1 illustrates in block diagram form a data processing system 20 having a non-volatile memory 30 according to the present invention. Data processing system 20 includes generally a central processing unit (CPU) 21 bidirectionally connected via a bus 22 to a bus interface unit 23. CPU 21 may be, for example, a CPU core of a one-chip microcomputer but may also be implemented as a separate integrated circuit. Interface unit 23 has an output terminal for providing a memory address labelled "ADDRESS", an input terminal for receiving a value labeled "DATA OUT", and an output terminal for providing a value labeled "DATA IN". Memory 30 has an output terminal for providing DATA OUT and input terminals for receiving the ADDRESS and DATA IN values. CPU 21 executes instructions and retrieves data and/or instructions from memory 30. Note that if implemented in discrete integrated circuits, memory 30 would typically be connected to bus interface unit 23 via a single bidirectional data bus. Note also that data processing system 20 includes additional control signals which are necessary to perform the memory read, write, and erase cycles. These control signals are conventional and are not important to understanding the present invention and thus are omitted from FIG. 1.

In order to program and erase non-volatile memory cells in memory 30, memory 30 also has an input for receiving a signal labelled "WORD LINE VOLTAGE" and a separate input for receiving a signal labelled "DRAIN VOLTAGE", and the importance of these two signals will be explained further below. Data processing system 20 also includes a high voltage status (HVS) register bit 24, a program pulse counter 25, a timer circuit 26, and a voltage generation circuit 27. HVS register bit 24 is connected to an input of program pulse counter 25. HVS register bit 24 is a status bit and is asserted each time a programming pulse is active to advance a count value of program pulse counter 25. Program pulse counter 25 has an output for controlling timer circuit 26 and a separate output connected to voltage generation circuit 27. Program pulse counter 25 generates the count value for identifying each programming pulse of a series of programming pulses applied to memory array 40. Timer circuit 26 in turn has outputs for providing timing signals to voltage generation circuit 27 and to HVS register bit 24. Timer circuit 26 is used to control the duration of each of programming pulses of the series of programming pulses.

Voltage generation circuit 27 includes a charge pumps block 28 and a voltage divider circuit 29. Voltage generation circuit 27 controls the voltage of the programming pulses. Charge pumps circuit 28 has an input connected to a first one of the outputs of timer circuit 26, and an output connected to memory 30 for providing the WORD LINE VOLTAGE signal. The WORD LINE VOLTAGE signal has a selectable duration controlled by timer circuit 26. Voltage divider circuit 29 has inputs connected to the second output of program pulse counter 25 and to the second output of timer circuit 26, a voltage reference input terminal for receiving a voltage labeled "Vpp", and an output terminal for providing the DRAIN VOLTAGE. Vpp is a voltage which is higher than the normal power supply voltage and is nominally 5.0 volts. In data processing system 20 Vpp is received at an integrated circuit input pin. In other embodiments, however, Vpp may be generated from the main power supply voltage using a conventional charge pump. Voltage divider circuit 29 provides DRAIN VOLTAGE as a series of pulses to the bit lines of memory array 40 via decode and voltage switching 35 for programming the array. The bit line pulses have a duration that is selectable and controlled by timer circuit 26, and a voltage magnitude that is controlled by selecting an appropriate tap of the voltage divider circuit 29. During programming, the bit line pulses and the word line pulses are provided at substantially the same time and have the same duration.

Figure 2:
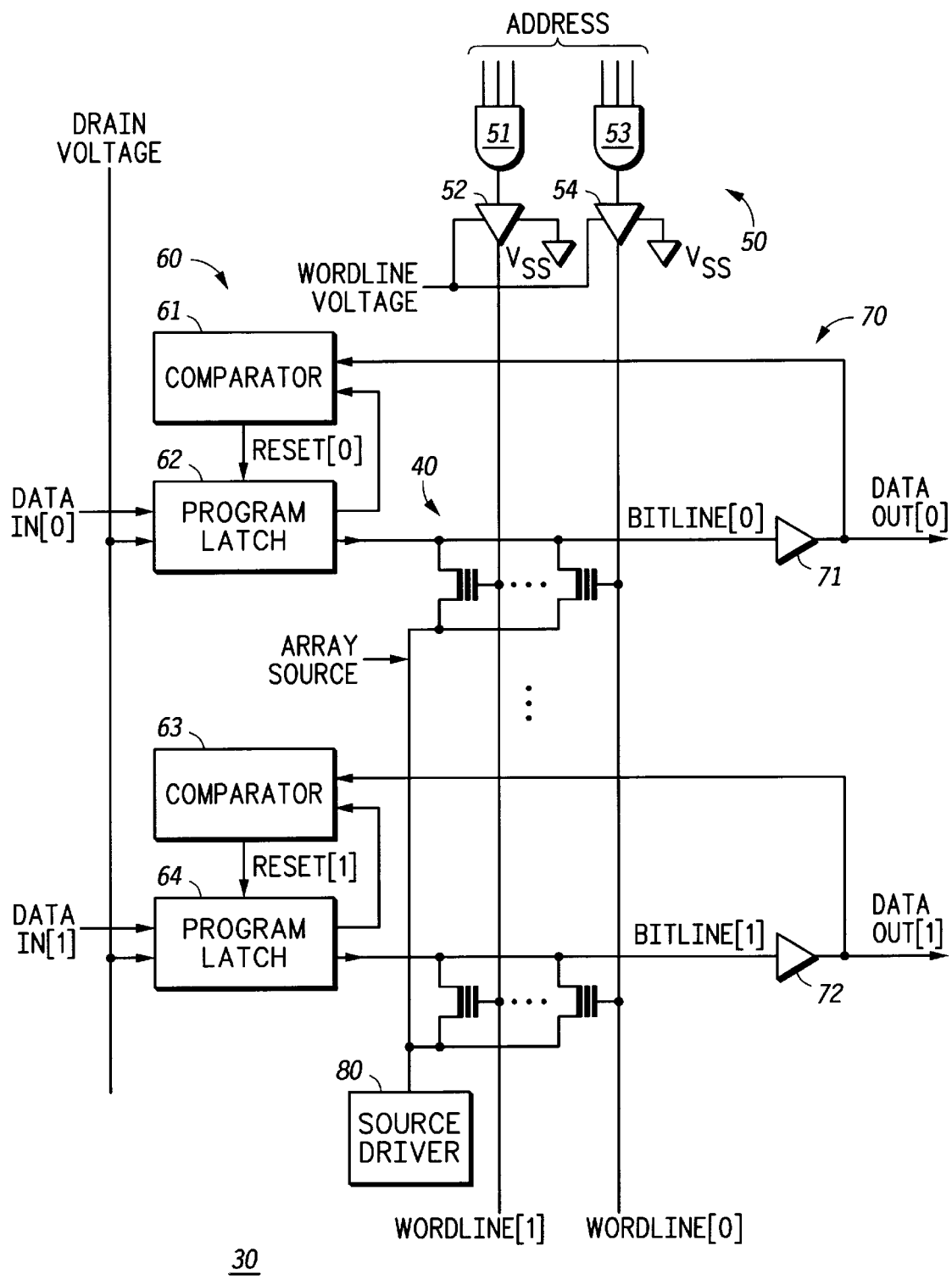
FIG. 2 illustrates in partial block diagram, partial logic diagram, and partial schematic form the memory of FIG. 1.

Memory 30 includes generally a decode and voltage switching block 35 and a memory array 40. As illustrated in FIG. 2, the non-volatile memory cells of memory array 40 organized as a matrix and are coupled at intersections of word lines and bit lines. Each of the memory cells has a control gate coupled to a word line, a source coupled in common, and a drain coupled to a bit line. Decode and voltage switching block 35 performs row and column decoding and also includes switches to provide high voltages into array 40 at appropriate times and in a manner which protects the transistors from excessive voltages. Array 40 is an array of rows and columns of 1T floating gate transistor cells in which each cell is located at a unique intersection of a row and column. Preferably array 40 is implemented in several subarrays or blocks. This partitioning of array 40 is advantageous because some of the blocks may be dedicated for special purposes such as storing a boot program. In addition since memory 30 is a flash EEPROM memory erasure can be achieved on a block by block basis so that separating array 40 into several blocks facilitates some applications requiring only partial erasure of data.

Memory 30 compensates for the skewed distribution in programming time in a manner which will be better understood with reference to FIG. 2, which illustrates in partial block diagram, partial logic diagram, and partial schematic form memory 30 of FIG. 1. As illustrated in FIG. 2, memory 30 includes array 40, an address decode and word line driver portion 50, a programming portion 60, a sense portion 70, and a source driver 80. Address decoding and word line portion 50 includes decoders and word line drivers for all word lines in array 40. Illustrated in FIG. 2 are two representative word lines labelled "WORDLINE[0]" and "WORDLINE[1]". Address decode and word line portion 50 includes a first AND gate 51 and a first buffer 52 driving WORDLINE[1], and a second AND gate 53 and a second buffer 54 driving WORDLINE[0]. Note that additional control signals which are necessary for operating memory array 30, such as control signals to enable address decode and word line driver 50, are omitted from FIG. 2.

As illustrated in FIG. 2 AND gate 51 has first, second, and third input terminals for receiving respective bits of the ADDRESS, and an output terminal. Buffer 52 has an input terminal connected to the output terminal of AND gate 51, an output terminal connected to WORDLINE[1], a positive power supply voltage terminal connected to a voltage labelled "$V_{SS}$", and a negative power supply voltage terminal for receiving a voltage labelled "WORDLINE VOLTAGE". In the illustrated embodiment, $V_{SS}$ is a ground power supply voltage which is equal to approximately zero volts, and the WORDLINE VOLTAGE is equal to approximately –9 volts. Thus when a particular word line in array 40 is selected it is driven to approximately –9 volts while all other word lines are driven to approximately zero volts.

Program latch portion 60 includes a comparator 61, a program latch 62, a comparator 63, and a program latch 64. Comparator 61 has an input terminal for receiving a signal labeled "DATA OUT[0]", a second input terminal, and an output terminal for providing a signal labeled "RESET[0]". Program latch 62 has a reset input terminal connected for receiving signal RESET[0], a data input terminal for receiving a signal labeled "DATA IN[0]", a power supply input terminal for receiving the DRAIN VOLTAGE, and a first output terminal connected to a first bit line labeled "BIT LINE[0]", and a second output terminal connected to the second input terminal of comparator 61. Comparator 63 has a first input terminal for receiving a signal labeled "DATA OUT[1]", a second input terminal, and an output terminal for providing a signal labeled "RESET[1]". Program latch 64 has an input terminal for receiving a signal labeled "DATA IN[1]", a reset input terminal for receiving signal RESET[1], a power supply voltage terminal for receiving the DRAIN VOLTAGE, a first output terminal connected to a second bit line labeled "BIT LINE[1]", and a second output terminal connected to the second input terminal of comparator 63. The bit lines are coupled to program latch portion 60. Program latch portion 60 temporarily stores data to be programmed into the non-volatile memory.

Sense amplifier portion 70 includes representative sense amplifiers 71 and 72. Sense amplifier 71 has an input terminal connected to BITLINE[0], and an output terminal for providing signal DATA OUT[0]. Sense amplifier 72 has an input terminal connected to BITLINE[1], and an output terminal for providing signal DATA OUT[1]. Source driver 80 has an output terminal connected to the sources of each transistor within memory array 40. Note that if memory array 40 is separated into blocks there would be a corresponding source driver for each block to allow block erasing. Note that additional circuitry not shown in FIG. 2 will typically be present. For example, a column decoder and column select circuitry is typically connected to the bit lines so that multiple bit lines can share a single sense amplifier. However the presence and decoding of column decoders will vary from embodiment to embodiment and will not be discussed further.

In operation, memory 30 operates as a conventional flash EEPROM memory. However memory 30 includes an additional feature important to understanding the present invention. Corresponding to each bit line is a comparator which compares the output of the program latch to the output of the sense amplifier. This comparison function is important for allowing programming voltages to be applied to the memory cells only for the amount of time necessary. As will be explained further below if a memory cell is a fast programming cell, comparators such as comparators 61 and 63 allow the sequence of programming pulses to be ended once the cell has been programmed to the appropriate value. Note also that preferably memory 30 includes a page programming function in which values are written to all memory cells along a selected word line even though data may be sensed out of memory 30 in smaller units. This facilitates quicker programming of memory 30. Note further that if memory 30 is separated into multiple blocks, each block is preferably capable of performing page programming simultaneously with all other blocks.

Figure 3:
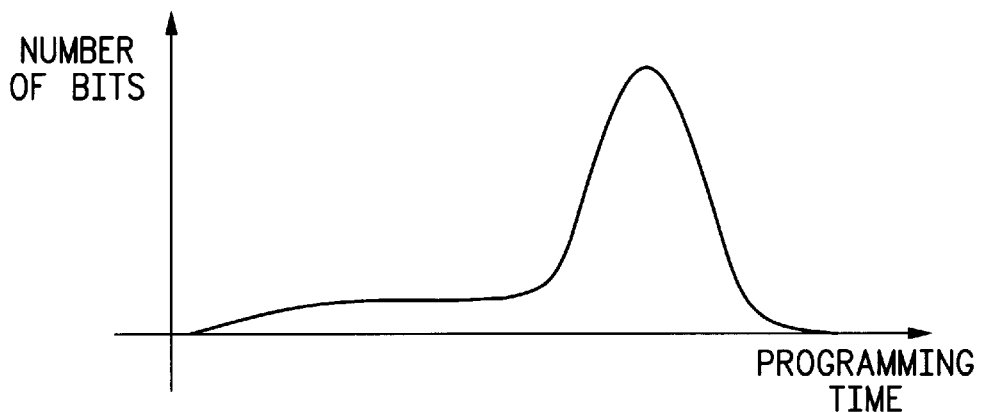
FIG. 3 illustrates a graph of the distribution of programming times of cells of the array of FIG. 2.

FIG. 3 illustrates a graph of the distribution of programming times of the cells in array 40 of FIG. 1. In FIG. 3 the horizontal axis represents programming time and the vertical axis the number of bits programmed within the given amount of program time. Notice that there are two modes or areas of concentration. One of these areas occurs after a relatively short amount of time, and the other one occurs after a relatively long amount of time. The first concentration represents fast programming cells and this concentration is separated in time from the programming time of the remainder of the cells. Memory 30 recognizes this skewed distribution of programming times and programs both areas of cells without over-programming them. Note that FIG. 3 is not drawn to scale and is intended to only show that some cells in a floating gate memory array may require much less time to program than the rest of the cells.

Figure 4:
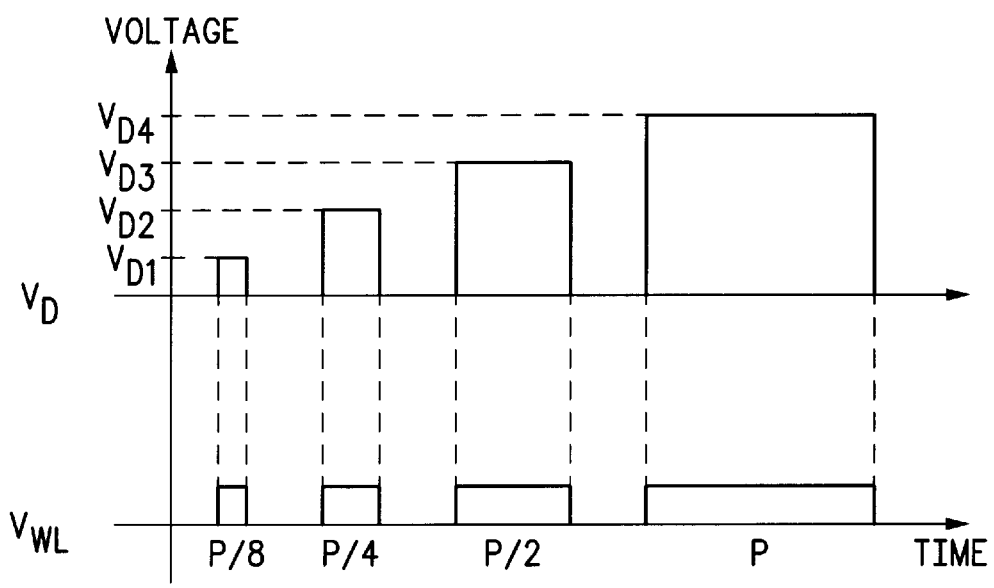
FIG. 4 illustrates a timing diagram of programming pulses used to program the memory of FIG. 1.

FIG. 4 illustrates a timing diagram of programming pulses used to program memory 30 of FIG. 1. In FIG. 4 the horizontal axis represents time whereas the vertical axis represents voltage magnitude. FIG. 4 illustrates two voltages. The first voltage is the DRAIN VOLTAGE and is labeled "$V_D$", and the second voltage is the WORDLINE VOLTAGE and is labelled $V_{WL}$, which is actually a negative voltage. According to the present invention, memory 30 drives the $V_{WL}$ to a constant level during four discrete time periods, in which each of these pulses are generated using pulse widths of increasing duration. If the basic pulse width is labelled "P", the first pulse has a pulse width or time duration equal to P/8, the second pulse has a pulse width equal to P/4, the third pulse has a pulse width equal to P/2, and the fourth pulse has a pulse width of P.

Corresponding to these programming pulses on $V_{WL}$ are four pulses on $V_D$, each having a duration which is the same as the corresponding pulses on $V_{WL}$. However, according to the present invention, successive $V_D$ pulses increase in magnitude, the first pulse having a magnitude of $V_{D1}$, the second pulse having a magnitude of $V_{D2}$, the third pulse having a magnitude of $V_{D3}$, and the fourth pulse having a magnitude of $V_{D4}$. Since the electric field applied between the control gate and the drain is proportional to the difference between $V_D$ and $V_{WL}$, it increases throughout the programming period. In the illustrated embodiment, memory 30 operates on a main power supply voltage of 3 volts and Vpp has a value of 5 volts. The four values used for $V_D$ are preferably $V_{D1}$=3 volts, $V_{D2}$=3.5 volts, $V_{D3}$=4 volts, and $V_{D4}$=Vpp which is approximately 5 volts.

Figure 5:
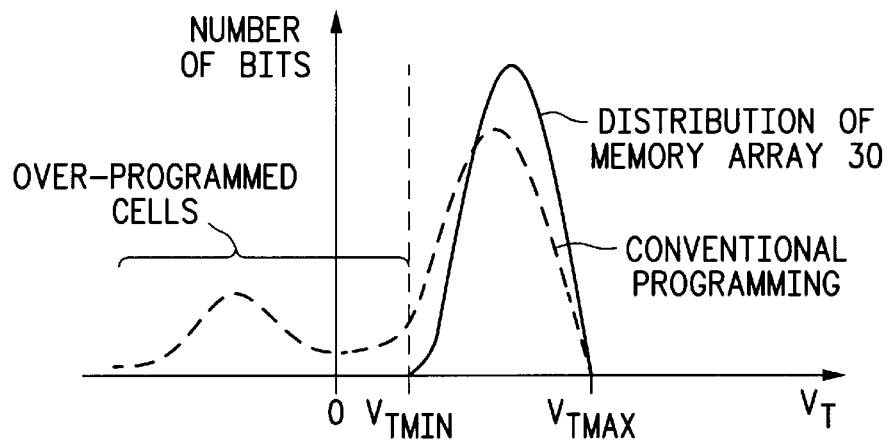
FIG. 5 illustrates a graph comparing the distributions of programmed thresholds according to the present invention with conventional programmed thresholds.

As can be seen in FIG. 4 the electric field is applied in increasing magnitude and duration throughout the sequence of programming pulses. The result is shown in FIG. 5, which illustrates a graph comparing the distributions of programmed thresholds according to the present invention with conventionally programmed thresholds. In FIG. 5 the horizontal axis represents transistor threshold voltage, labelled "$V_T$", whereas the vertical axis represents number of bits. FIG. 5 illustrates two representative curves. The first curve is achieved by applying conventional programming techniques of a fixed pulse width and fixed voltage to the distribution of FIG. 3. This distribution has most thresholds in a desired range of values between a low desired value labelled "$V_{TMIN}$" and a high desired value labelled $V_{TMAX}$. However the conventional programming distribution also results in a significant number of bits whose thresholds are below $V_{TMIN}$. In particular a significant number of bits have threshold voltages which are less than zero volts. These bits are especially deleterious to proper operation of memory 30 and must be compensated for by techniques such as that taught by U.S. Pat. No. 5,357,476 referred to above. All threshold values less than $V_{TMIN}$ represent overprogrammed cells. However it is desirable for all cells to have distributions between $V_{TMIN}$ and $V_{TMAX}$. The second curve represents the distribution of thresholds obtained from FIG. 3 due to the application of the present invention. Note that all the thresholds are between $V_{TMIN}$ and $V_{TMAX}$.

How this distribution of thresholds is achieved is better understood by considering FIGS. 4 and 5 together. Between each programming pulse the comparator and program latches are enabled to sense the states of memory cells. If a cell achieves its correct logic state, its corresponding comparator such as comparator 61 or 63 activates its corresponding reset signal to cease application of any further programming pulses. This circuitry in conjunction with the timing and magnitude of $V_D$ allows for prevention of over-programming even in memories with significant numbers of fast programming bits. For example a typical fast program cell may achieve its desired program state after the application of the second pulse. In this situation the comparators in programming portion 60 cause further pulses not to be applied to the drains of corresponding transistors. However, for the majority of cells with longer programming times, pulses continue to be applied in increasing duration and magnitude. The use of both pulse width and pulse magnitude adds an extra degree of flexibility and robustness, appropriately programming cells with both fast and normal programming times in an efficient manner.

In another embodiment, the programming pulses that are applied to both $V_{WL}$ and $V_D$ may be applied as a first series of four pulses of increasing duration but having a constant voltage. For example, the first pulse of the first series has a duration of P/8, the second pulse has a duration of P/4, the third pulse has a duration of P/2, and the fourth pulse has a duration of P, as is illustrated in FIG. 4 for $V_{WL}$. Each pulse of the first series of four pulses are at the same magnitude, for example, $V_{D1}$. If all of the cells have not been successfully programmed and further programming pulses are required, the first series of four pulses is followed by a second series of four pulses. The second series of fourth pulses are of increasing duration like the first series, however, the second series of pulses are applied at a higher magnitude of $V_{D2}$. Likewise, subsequent series of pulses are applied in like manner until all of the memory cells of the array are programmed.

Figure 6:
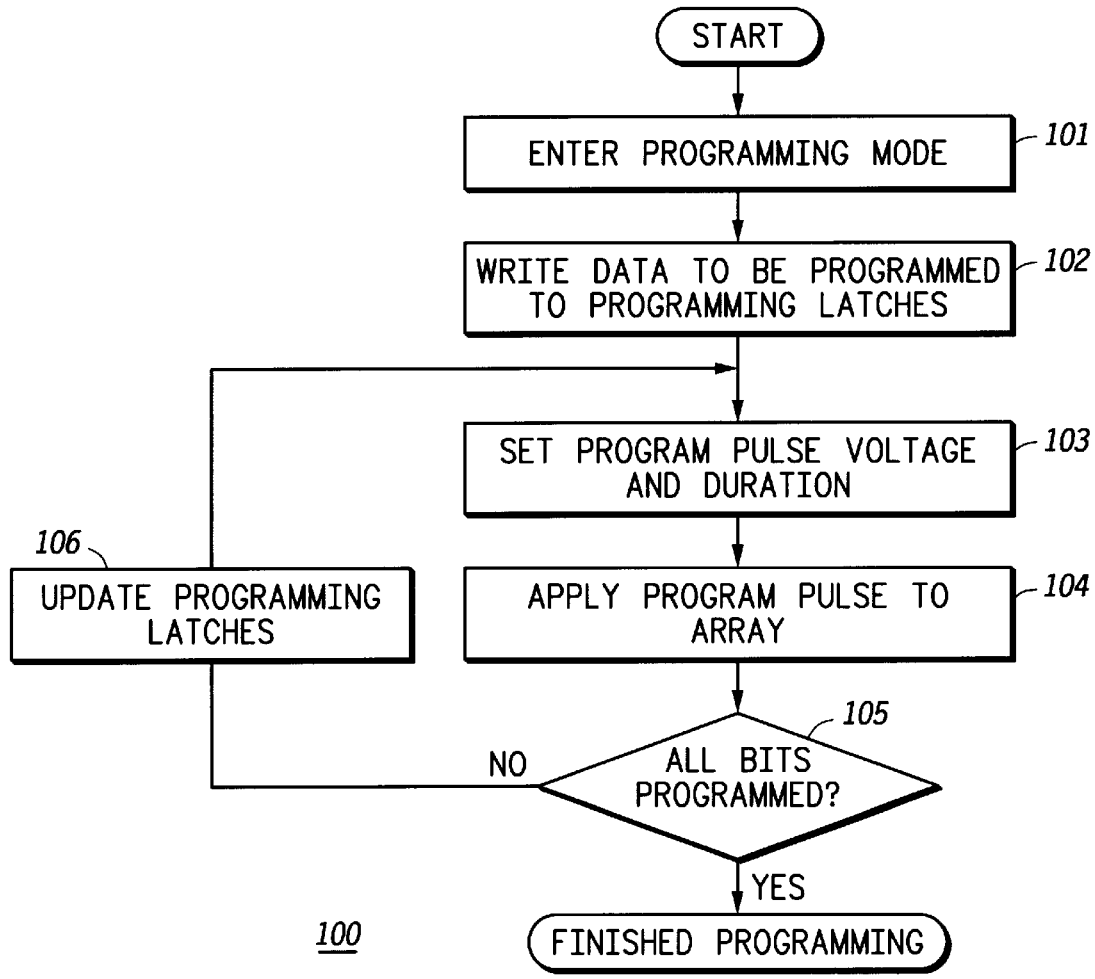
FIG. 6 illustrates a flow chart of the programming method of the non-volatile memory of FIG. 1.

FIG. 6 illustrates a flow diagram 100 illustrating the programming method of memory 30 of PIG. 1. The programming operation starts at step 101 by entering the programming mode. Programming mode may be entered in a variety of ways such as writing a bit to a control register or activating certain control input signals. Next at step 102 data is written to the programming latches such as 62 and 64. Typically this data will be written through a control program running on CPU 21. Next at step 103 the program pulse voltage and duration are set as discussed above and illustrated in FIG. 1. The voltage and duration varies as illustrated in FIG. 4 above. Next at step 104 the program pulses in voltages $V_D$ and $V_{WL}$ are applied to array 40. At step 105 the state of the bits to be programmed is compared and if all bits have been successfully programmed, the programming operation is complete. If not, at step 106 the programming latches which are connected to programmed bit cells are reset, but the other bit lines remain active for subsequent programming pulses. In a subsequent flow through the loop the program pulse voltage and duration is again increased at step 103. This sequence is repeated until all program bits have been successfully programmed.

While the invention has been described in the context of a preferred embodiment, it will be apparent to those skilled in the art that the present invention may be modified in numerous ways and may assume many embodiments other than that specifically set out and described above. For example, while four discrete steps and four discrete time periods were illustrated, more pulses with the same number of a larger number of steps may be used. Accordingly, it is intended by the appended claims to cover all modifications of the invention which fall within the true scope of the invention.

We claim:

1. A memory, comprising:
    a memory array having a plurality of non-volatile memory cells, each of the memory cells having a control gate coupled to a word line, a source coupled in common, and a drain coupled to a bit line; and
    a programming circuit, coupled to the memory array, for providing a series of word line pulses to the word line and a series of bit line pulses to the bit line for programming the memory array, wherein a first bit line pulse of the series of bit line pulses has a first duration and a first voltage, and wherein a subsequent bit line pulse of the series of bit line pulses has a second duration different than the first duration and a second voltage different than the first voltage, and a first word line pulse of the series of word line pulses has a duration equal to the first duration and a subsequent word line pulse of the series of word line pulses has a duration equal to the second duration, and the word line pulse is provided at substantially the same time as the bit line pulse.

2. The memory of claim 1, wherein the programming circuit comprises:
    a program pulse counter for generating a count value for identifying each time a bit line pulse and word line are applied to the memory array;
    a timer circuit, coupled to the program pulse counter, for selectively controlling a duration of each of the bit line pulse and the word line pulses; and
    a voltage generation circuit, coupled to the program pulse counter, for selectively controlling a voltage of each bit line pulse.

3. The memory of claim 2, further comprising a status bit that is asserted in response to a programming pulse of a series of programming pulses being active, and the status bit is negated in response to the programming pulse being negated, the status bit for advancing the program pulse counter.

4. The memory of claim 2, wherein the voltage generation circuit comprises:
    a charge pump circuit for providing the series of word line pulses to the word line, each word line pulse of the series of word line pulses having a selectable predetermined duration during a program operation of the memory; and
    a voltage divider circuit for providing the series of bit line pulses to the bit line, each bit line pulse of the series of bit line pulses having a selectable predetermined voltage, wherein the selectable predetermined voltage is provided for the predetermined duration.

5. The memory of claim 1, wherein the memory is characterized as being embedded in a data processing system implemented on a single integrated circuit.

6. The memory of claim 1, wherein the memory array is characterized as being a flash memory having a plurality of floating gate transistors.

7. A method for programming a non-volatile memory, the non-volatile memory having a plurality of non-volatile memory cells, the non-volatile memory cells organized in an array, each memory cell is coupled at intersections of word lines and bit lines, each of the memory cells having a control gate coupled to a word line, a source coupled in common, and a drain coupled to a bit line, the bit lines coupled to a plurality of latch circuits, the plurality of latch circuits for temporarily storing data to be programmed into the non-volatile memory, the method comprising the steps of:

1) writing data to be programmed into a portion of the array to the plurality of latch circuits;
2) setting a first duration and a first voltage of a first bit line pulse of a series of bit line pulses, and setting a first word line pulse of a series of word line pulses to have the first duration;
3) applying the first bit line pulse and the first word line pulse to the portion of the array at substantially the same time;
4) reading data from the portion of the array;
5) determining that at least some of the memory cells of the portion of the array were not successfully programmed;
6) updating the data stored in the plurality of latch circuits;
7) setting a second duration and a second voltage of a second bit line pulse of a series of bit line pulses, the second duration being different than the first duration and the second voltage being different than the first voltage and setting a second word line pulse to have the second duration;
8) applying the second bit line pulse and the second word line pulse to the array for programming remaining unprogrammed memory cells of the portion of the array; and 9) repeating steps 4) through 8) until all of the memory cells of the portion of the array are programmed.

8. The method of claim 7, wherein the portion of the array is characterized as being a page.

9. A data processing system, comprising:
a central processing unit for executing instructions and retrieving data;
an array of non-volatile memory cells, coupled to the central processing unit, for storing the instructions and/or the data;
a program pulse counter for generating a count value for identifying each time a bit line pulse and a word line pulse are applied to the memory array during a program operation of the memory array;
a timer circuit, coupled to the program pulse counter, for selectively controlling a duration of each of the bit line pulses and the word line pulses; and
a voltage generation circuit, coupled to the program pulse counter, for selectively controlling a voltage of each bit line pulse, wherein a first bit line pulse of the has a first duration and a first voltage, and wherein a subsequent bit line pulse has a second duration different than the first duration and a second voltage different than the first voltage, and wherein a first word line pulse has the first duration and a second word line pulse has the second duration, and wherein the first word line pulse is provided at substantially the same time as the first bit line pulse.

10. The data processing system of claim 9, further comprising a status bit that is asserted in response to a bit line pulse being active, and the status bit is negated in response to the bit line pulse being negated, the status bit for advancing the program pulse counter.

11. The data processing system of claim 9, wherein each of the memory cells having a control gate coupled to a word line, a source coupled in common, and a drain coupled to a bit line.

12. The data processing system of claim 11, wherein the voltage generation circuit comprises:
a charge pump circuit for providing a series of word line pulses to a word line of the array, each word line pulse of the series of word line pulses having a selectable predetermined duration during a program operation of the memory; and
a voltage divider circuit for providing a series of bit line pulses to a bit line of the array, each bit line pulse of the series of bit line pulses having a selectable predetermined voltage, wherein the selectable predetermined voltage is provided for the predetermined duration.

13. The data processing system of claim 12, further comprising:
a program latch having a first input for receiving data, a second input coupled to the voltage divider circuit for receiving the series of bit line pulses, a first output coupled to a bit line, and a second output;
a sense amplifier having a input coupled to the bit line, and an output, the sense amplifier for sensing and amplifying the data from the bit line; and
a comparator having a first input coupled to the output of the sense amplifier, a second input coupled to the second output of the program latch, and an output for providing a reset signal to the program latch in response to the data at the output of the sense amplifier matching the data at the second output of the program latch.

14. The data processing system of claim 9, wherein the array of non-volatile memory cells is characterized as being a flash memory array having a plurality of floating gate transistors.

* * * * *